July 6, 1954 M. E. HARDY 2,682,774

PRESET TUNING MECHANISM

Filed March 20, 1953 2 Sheets-Sheet 1

MAURICE E. HARDY.
*INVENTOR.*

BY Francis W. Crotty

HIS ATTORNEY.

July 6, 1954 M. E. HARDY 2,682,774

PRESET TUNING MECHANISM

Filed March 20, 1953 2 Sheets-Sheet 2

MAURICE E. HARDY.
*INVENTOR.*

BY Francis W. Crotty

HIS ATTORNEY.

Patented July 6, 1954 2,682,774

UNITED STATES PATENT OFFICE 2,682,774

PRESET TUNING MECHANISM

Maurice E. Hardy, Chicago, Ill., assignor to Zenith Radio Corporation, a corporation of Illinois Application March 20, 1953, Serial No. 343,684

7 Claims. (Cl. 74—10.15)

This invention pertains to a preset mechanism for a continuous type of turner employed to adjustably tune a wave-signal translating apparatus over a band of operating frequencies. Although the invention is useful in any application where extreme accuracy of tuning is desired, it is particularly valuable in conjunction with a television set for effecting selective reception of signals in the ultra high frequency band extending from 480 to 890 megacycles and will be described in that connection.

The allocation of an additional 69 frequency channels within the UHF band has presented several difficult problems in the design and manufacture of television receivers in order that such receivers may be capable of receiving signals in that band. One of the more economical types of tuning device operable over the entire range of UHF frequencies comprises a continuous tuner including a plurality of impedance elements, a corresponding plurality of adjustable tuning members for varying the effective impedance of those elements, and a uni-control mechanism for concurrently regulating the positions of the tuning members. A continuous tuner of this type is described and claimed in the copending application of John F. Bell and Lloyd Matthews, Serial No. 277,194, filed March 18, 1952 and assigned to the same assignee as the present invention. The uni-control mechanism used in that tuner is specifically claimed in a copending application of Arvid E. Chelgren, Serial No. 202,227, filed December 22, 1950, now Patent No. 2,632,109, issued March 17, 1953 and likewise assigned to the same assignee as the present invention. It includes a pivotally mounted carriage and an adjustable coupling mechanism linking the carriage and the tuning members to translate pivotal movement of the carriage into controlled linear movement of the tuning members. This device has proven eminently satisfactory; however, attempts to apply preset actuating mechanisms to this type of tuner and to similar UHF tuners have proven difficult, due to the fact that a very small movement of the carriage may produce extremely large changes in the resonant frequencies of the tuned impedances. For example, in practical embodiments of the continuous tuner described in the above-mentioned applications, a linear movement of approximately four-thousandths of an inch on the part of the tuning members represents the average travel required to change the tuning of the receiver from one frequency channel to the next adjacent channel. Furthermore, this travel is reduced to approximately two-thousandths of an inch on the steeper parts of the tuner characteristic curve. Accordingly, a preset mechanism applied to such a tuner can have virtually no effective backlash or lost motion if it is to be satisfactory in operation, especially if it is to meet requirements in respect of reset accuracy. This type of accuracy is not possible with the known push button or detenting mechanisms currently in use in radio or VHF television receiver applications.

It is an object of this invention, therefore, to provide a preset tuning mechanism which inherently minimizes any possibility of effective lost motion or backlash in its elements.

It is a further object of this invention to provide an improved preset tuning mechanism for a continuous tuner which actuates the tuner to a fixed and accurate predetermined tuning position in response to movement of a tuning control to an approximation of that predetermined position.

It is a corollary object of this invention to provide an improved preset mechanism which eliminates irregular positioning surfaces and utilizes only the most accurate of geometrical shapes to determine the adjustment of the controlled components of the tuner.

It is an additional object of this invention to provide an improved preset tuning mechanism which effectively permits individual adjustment of each of the preset positions.

Accordingly, one feature of the invention provides a preset tuning mechanism for a continuous tuner of the type including at least one impedance element, a tuning member for varying the impedance of that element, a pivotally mounted carriage, and mechanical coupling means linking the carriage and the tuning member to translate pivotal movement of the carriage into linear movement of the member. The preset mechanism comprises a selector assembly including a selector shaft and a plurality of individual arcuate stop abutment surfaces axially spaced along and angularly disposed about the shaft, each of these surfaces having a predetermined radial displacement from the shaft. A corresponding plurality of individually adjustable stop members are mounted on the carriage in alignment with the selector assembly and are individually selectively engageable with an assigned one of the stop abutment surfaces to determine a corresponding plurality of preset operative positions for the carriage. Bias means are included to urge the stop members toward the selector assembly, and a mechanical driving system is employed to effect step-by-step rotation of the selector assembly. The driving system includes means for pivoting the carriage to a reference position in which each of the stop members is free of its associated stop abutment surface prior to each of the rotational steps and for releasing the carriage to pivot to one of its preset positions following each such rotational step.

Another feature of the invention provides an actuating mechanism for a wave-signal receiver comprising at least one frequency-determining impedance element for conditioning the receiver to operate over a wide band of frequencies, a tuning member to vary the effective impedance of that element, and a carriage mechanically coupled to the tuning member and mounted for movement along a predetermined path to determine the instantaneous operating frequency of the receiver. The actuating mechanism comprises a selector mechanism including a plurality of preset elements individually selectively operable to adjust the carriage to a predetermined preset position on its path of movement, each of the positions corresponding to a predetermined operating frequency within the band. A continuous driving mechanism, selectively engageable with the carriage, is employed to move the carriage to any point along a predetermined portion of its path. A mechanical driving system is coupled to the selector and continuous driving mechanism; the mechanical drive is operable over a first range of operation to actuate the selector mechanism to the exclusion of the continuous driving mechanism and selectively adjust the carriage to the preset positions. The mechanical driving system is further operable over a second range of operation to actuate the continuous driving mechanism to the exclusion of the selector and effect movement of the carriage to any point along the above-mentioned predetermined portion of its path.

The features of the invention which are believed to be novel are set forth with particularity in the appended claims. The organization and manner of operation of the invention, together with further objects and advantages thereof, may best be understood by reference to the following description taken in conjunction with the accompanying drawings, in which:

Figure 1:
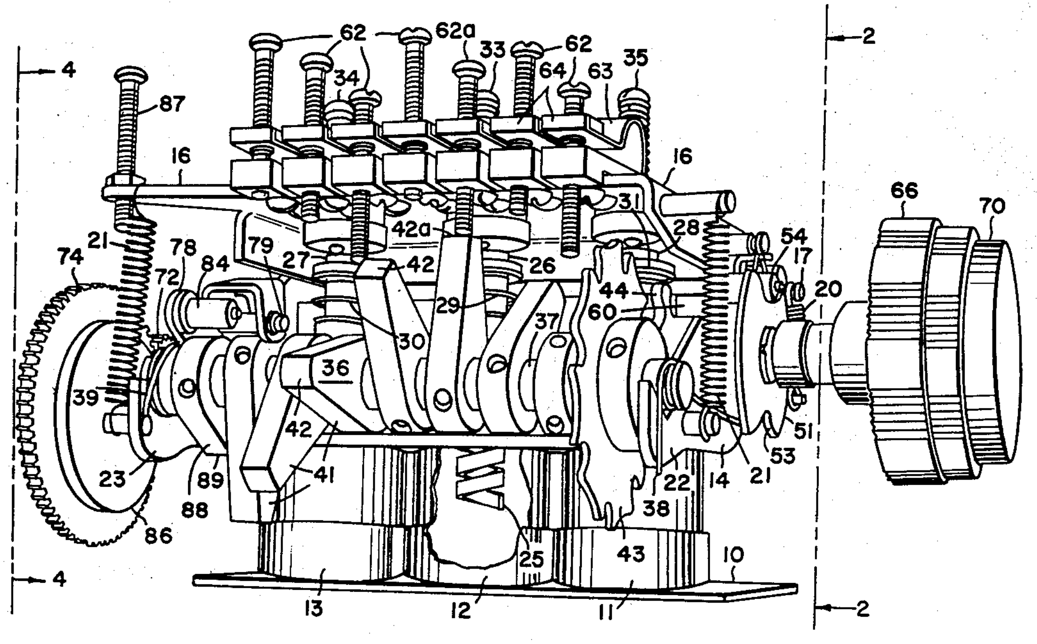
Figure 1 is a perspective view, partly cut away, of a continuous tuner and an associated preset tuning mechanism embodying the invention.

Figure 1 illustrates a continuous tuner for a television receiver including a base 10 and three shield members 11, 12 and 13 mounted thereon. As more clearly illustrated in Figure 2, a frame 14 is supported upon shield structures 11—13 and a carriage 16 is pivotally mounted on frame 14 by means of a pair of pins 17 engaged in two V-shaped slots 18 formed in the frame; only one of the pins and one of the slots appear in Figure 2. Pivot pins 17 are firmly seated in slots 18 by means of a pair of springs 20 coupling the pins to frame 14. At the end of frame 14 opposite slots 18, a pair of springs 21 are connected between carriage 16 and the extensions 22 and 23 of frame 14, as seen in Figure 1. Each of the shield structures 11—13 has mounted within it an impedance element as, for example, coil 25 shown in the cut-away portion of shield 12, and three tuning members 26, 27 and 28 are individually aligned with these impedance elements. Springs 29, 30 and 31 are individually associated with tuning members 26, 27 and 28 respectively; these springs bias the tuning members toward carriage 16. Three individually adjustable coupling devices 33, 34, and 35 are mounted on carriage 16 and engage tuning members 26, 27 and 28 respectively.

The apparatus as thus far described is essentially identical with that of the aforementioned copending applications, and a detailed description of its operation is therefore deemed unnecessary. Briefly, the impedance of the three impedance elements 25 mounted within shield structures 11—13 is varied by axial movement of cores 26—28 with respect to the impedance elements. This movement is controlled by the uni-control mechanism comprising frame 14, carriage 16, and linkage devices 33—35. The impedances form a part of a wave-signal receiver and are employed to condition that receiver for operation over a wide range of frequencies such as the UHF television band, the instantaneous operating frequency of the receiver being determined by the impedances of elements 25, in turn determined by the positions of tuning members 26—28 and carriage 16. The remainder of the receiver forms no part of the invention and has not been shown.

Returning to Figure 1, the structure there illustrated further includes a selector assembly 36 comprising a selector shaft 37 which is rotatably mounted in extensions 22 and 23 of frame 14 and is maintained in engagement therewith by means of a pair of springs 38, 39. A plurality of stop abutment members 41 are mounted on shaft 37, being axially spaced along the shaft and angularly displaced with respect to each other. Each of the stop abutment members 41 includes a stop abutment surface 42 which is arcuate in form, the center of the arc in each case being the rotational axis of shaft 37. Each of surfaces 42 thus has a predetermined constant radial displacement from shaft 37.

Figures 2, 3:
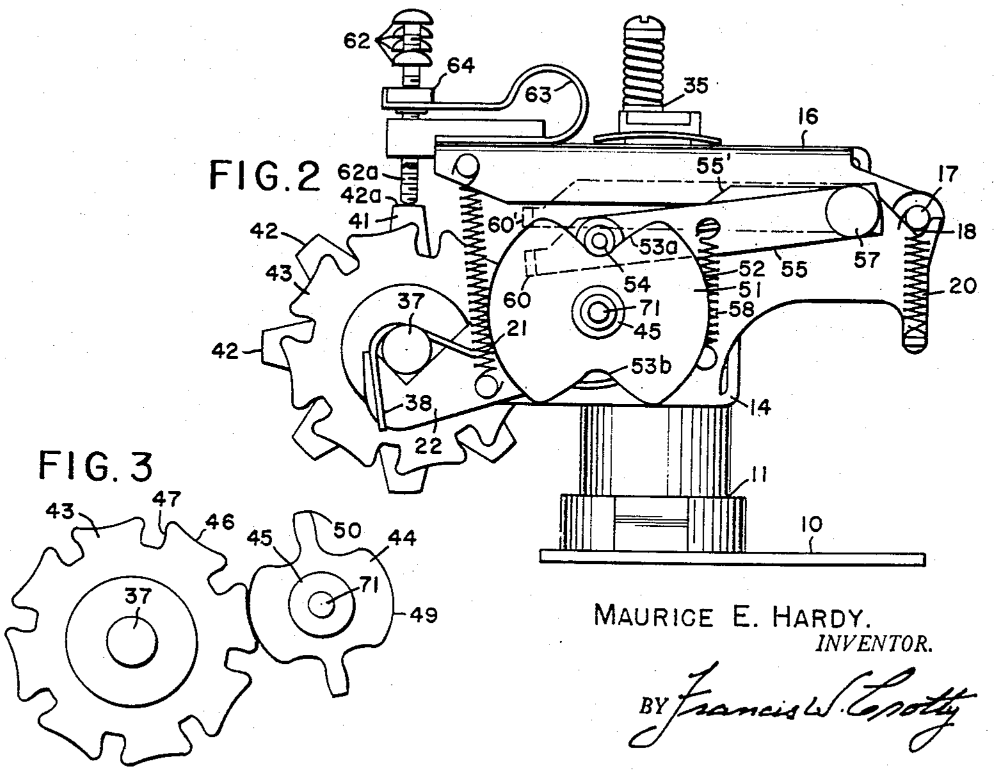
Figure 2 is a partially sectional view of the tuner taken along line 2—2 of Figure 1.
Figure 3 is a detailed view of a part of the apparatus shown in Figure 2.

As more clearly seen in Figures 2 and 3, a cam-gear 43 is mounted at one end of shaft 37 and engages a mating cam-gear 44 which is mounted on a stub shaft 45 journalled in extension 22 of frame 14. Cam gear 43 includes a plurality of cam surfaces 46 and a corresponding plurality of gear recesses 47, whereas gear 44 is provided with two cam surfaces 49 and a pair of gear teeth 50. An actuating cam 51 is also fixed to stub shaft 45 and comprises a pair of arcuate sections 52 separated by two cam notches 53 and 53*b*. Cam 51 engages a pin 54 fixed to a lever 55 which is pivotally mounted on frame 14 by means of a pin 57 and is biased toward cam 51 by a spring 58 coupling lever 55 to frame 14. Lever 55 is provided with an extension 60 at the end opposite its connection to pin 57; as more clearly seen in Figure 1, extension 60 extends beneath carriage 16.

A plurality of individually adjustable stop members 62 are mounted on carriage 16 in alignment with selector assembly 36; each of the stop members comprises a screw threaded into a portion of the carriage and a multiple spring and nut arrangement, including springs 63 and nuts 64, maintains stop members 62 in their adjusted positions. The spacing between stop members 62 corresponds to the axial spacing of stop abutment elements 41 along shaft 37 so that the stop members are individually selectively engageable with assigned ones of the surfaces 42. As indicated in Figures 1 and 2, stop member 62a is presently engaged by stop abutment surface 42a. Means for rotating stub shaft 45 are provided, in this instance comprising a knob 66 directly fixed or coupled to the shaft.

In Figures 1 and 2, the tuning mechanism is shown in one of its several preset operative positoins. Carriage 16, as urged by springs 21, is in contact with selector assembly 36 through the abutment of stop member 62a against stop abutment surface 42a. Since the position of carriage 16 directly determines the positions of tuning members 26—28, the operating frequency of the tuner and, therefore, of the receiver with which the tuner is associated, is likewise determined by the engagement of elements 62a and 42a. To change the operational setting of the tuner, knob 66 is rotated through an angle of 180°. At the start of the rotation of knob 66, the corresponding rotational movement imparted to shaft 45 causes cam 51 to rotate and the engagemen of notch 53a with pin 54 moves lever 55 upward toward the position shown by dot-dash outline 55′. When lever 55 reaches position 55′, extension 60 of the lever, indicated in the dot-dash outline as 60′, engages carriage 16 so that continued rotation of the cam moves carriage 16 against the bias of springs 21 to a reference position in which all of the stop members 62 are free of their associated stop abutment surfaces 42. The reference position is determined by the engagement of pin 54 with one of the arcuate cam sections 52 of cam 51; during the part of the rotational cycle in which pin 54 is engaged by one of the surfaces 52, both of which are of constant radius along the surface, no effective movement of the carriage takes place.

At the same time, during the aforedescribed initial period of rotation of control knob 66, cam gear 44 is also rotated, due to its connection to shaft 45, but does not effect any change in the position of selector assembly 36, since the arcuate cam portion 49 of gear 44 merely slides along the corresponding arcuate cam portion 46 of gear 43. However, after shaft 45 has been rotated sufficiently to move carriage 16 to its reference position, one of the teeth 50 engages one of the corresponding gear slots 47 on gear 43 and continued rotation of the shaft imparts rotational movement to selector shaft 37 of selector assembly 36. Inasmuch as the angular displacement of gear slots 47 corresponds to the angular displacement of stop abutment members 41 with respect to one another, the continued rotation of shaft 45 causes shaft 37 to rotate through an angle sufficient to bring the next one of stop abutment members 41 into alignment with its corresponding stop member 62. This rotation of the selector assembly is carried out completely during that portion of the rotational cycle in which carriage 16 is maintained in its reference position. When gear 44 has rotated a sufficient amount to bring the next one of arcuate cam surfaces 46 into alignment with the corresponding cam surface 49, thus interrupting movement of the selector assembly, continued rotation of shaft 45 brings cam notch 53b of cam into engagement with pin 54. This permits lever 55 to return toward its original inactive position and releases carriage 16 to pivot to its next preset operative position. This position is determined by the engagement of one of the stop members 62 with that one of stop abutment surfaces 42 which has been brought into alignment therewith.

Examination of the above-recited operational cycle indicates that the mechanical driving system including shaft 45, cam 51, lever 55 and cam-gears 43 and 44 provides for step-by-step rotation of selector assembly 36 through the preset positions established by the selector mechanism comprising assembly 36 and stop member 62, and further effectively pivots carriage 16 to a reference position in which each of stop members 62 is free of its associated stop abutment surface 42 prior to each rotational step. Thus, at the start of a change in tuning, stop members 62 are lifted from engagement with surfaces 42 and cannot be pulled or scraped against those surfaces; any possibility of excessive wear on stop abutment surfaces 42 is thus eliminated. Since the stop abutment surfaces are arcuate in form, they can be manufactured with the utmost precision, due to the fact that a circular or arcuate surface may be more precisely achieved than virtually any other surface shape available. An additional advantage is derived from the use of arcuate surfaces in that the presence of any minor errors in angular displacement of selector assembly 36 results in the presentation to the instantaneously effective one of stop members 62 of a surface that is still equi-distant from the basing point, shaft 37. Accordingly, any backlash or lost motion present in the driving mechanism, within such tolerance that the selected stop member 62 contacts its associated surface 42, is completely ineffective with respect to the ultimate position of carriage 16 and is consequently eliminated with respect to the operative condition of tuning impedances 25 and the frequency adjustment of the receiver with which the impedances are associated.

Figure 4:
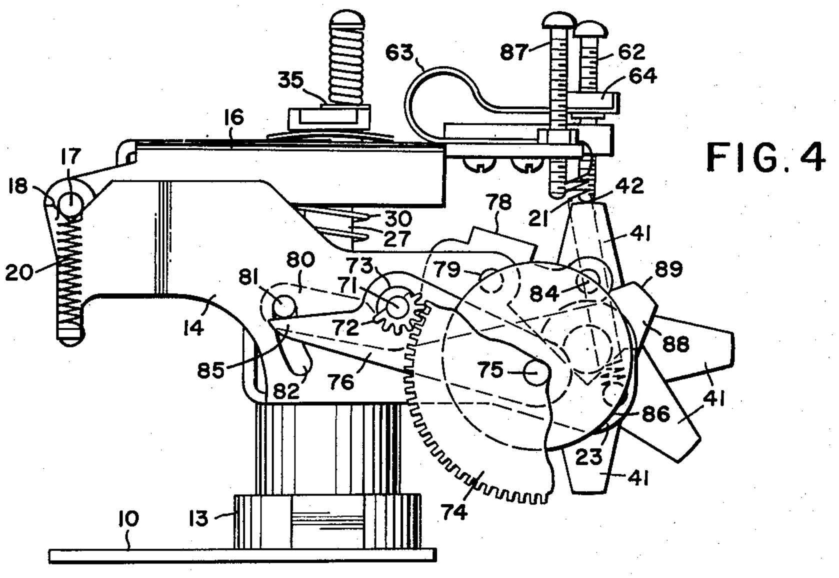
Figure 4 is an end view, partially sectional, of the tuner taken along line 4—4 of Figure 1.

In addition to the preset tuning mechanism described above, the apparatus of Figure 1 also incorporates provision for continuous adjustment of the position of carriage 16 through at least a portion of its path of movement; for the embodiment shown, this portion covers the entire path of movement of the carriage. A second knob 70, concentric with knob 66, is fixed to an additional drive shaft 71 which is mounted internally of stub shaft 45 (see Figure 2). Shaft 71 extends through the entire mechanism, the opposite end of the shaft being journalled in a bearing 73 in extension 23 of frame 14, as shown in Figure 4. A spur gear 72 is affixed to that part of shaft 71 which extends beyond bearing 73; spur gear 72 engages a driven gear 74 which is mounted on a pin 75 extending from a lever 76. Lever 76 is freely pivotally mounted on shaft 71. An actuating lever 78 is pivotally mounted on a pin 79 affixed to frame extension 23 and carries at one extremity 80 a pin 81 which projects through an elongated arcuate slot 82 in frame 14. Pin 81 engages an extension 85 projecting from lever 76 at the end of the lever opposite pin 75.

Pin 75, in addition to serving as a shaft for gear 74, supports an eccentric 86 which is affixed to gear 74 for rotation therewith. Eccentric 86 is aligned with a stop member 87, generally similar to stop members 62, mounted on carriage 16. As indicated in Figure 1, the end of lever 78 opposite extension 80 carries a coupling element, pin 84, which is positioned to engage the surface 89 of a cam 88 mounted on selector shaft 37. In order to avoid any ambiguity in operation, it is preferable to position cam 88 so that surface 89 does not engage pin 84 whenever selector shaft 37 is adjusted to any of the above-described preset positions in which the position of carriage 16 is determined by the alignment and engagement of one of stop members 62 with its associated stop abutment surface 42. For the embodiment shown, this relationship is obtained by equal angular displacement of stop abutment surfaces 42 and cam surface 89, with respect to each other, about shaft 37, so that when any of these surfaces is in its effective operative position the remainder of the surfaces are angularly displaced from and disengaged from their associated cooperating members.

As shown in Figure 4, gears 72 and 74, cam 86, levers 76 and 78, stop member 87, and cam 88 are all in their inoperative positions; that is to say, they have no effect upon the position of carriage 16 and therefore do not determine the position of tuning members 26—28 or the effective impedance of elements 25. All of these members, with the exception of cam 88, remain in the positions shown at all times when the tuning mechanism is adjusted to any of its preset operative positions determined by the engagement of one of the stop members 62 with its associated stop abutment surface 42. Cam 88, of course, rotates with shaft 37 through all of the positions; however, the configuration and alignment of the cam are such that it has no effect upon pin 84 or lever 78 when the tuning mechanism is adjusted to any one of the aforementioned preset positions, as noted above. Continued rotation of selector assembly 36 through its preset positions brings the selector assembly to one position in which no one of the stop abutment surfaces 42 is aligned with its corresponding stop member 62; as the selector assembly is moved to this position, surface 89 of cam 88 engages pin 84 to move lever 78 to the position shown in Figure 5.

Figure 5:
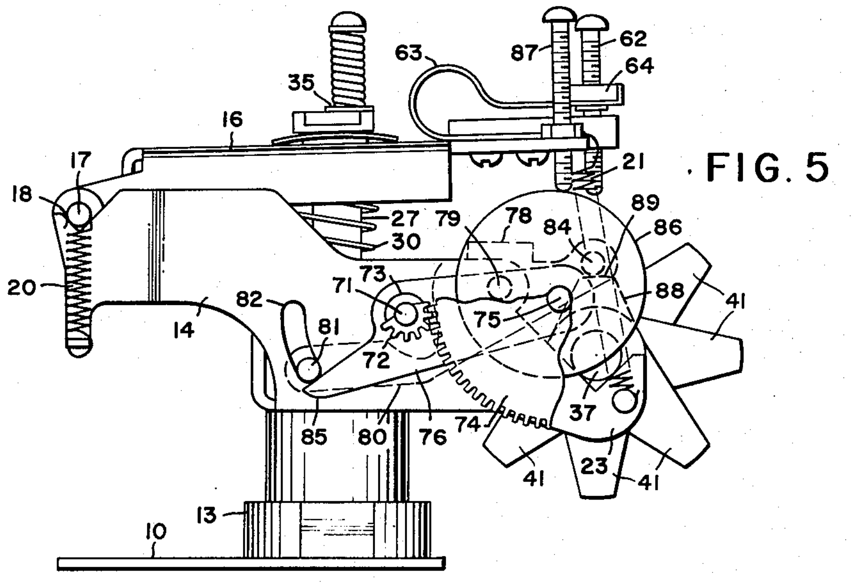
Figure 5 is a view of the apparatus of Figure 4 in a different operating condition.

In Figure 5, it is seen that the pivotal movement of lever 78 responsive to the engagement of pin 84 with cam surface 89 causes pin 81 to move through slot 82, thus pivoting lever 76 to the position shown. In this position, eccentric 86 is moved to an elevated operative position. Inasmuch as none of the stop abutment surfaces 42 are in position to interrupt the travel of carriage 16, the carriage would be free to move to its lowermost possible position. However, this is prevented by the engagement of stop member 87 with eccentric 86. With the apparatus in the position shown, rotation of shaft 71, which may be achieved independently of rotation of shaft 45 by movement of knob 70 alone, imparts a corresponding rotational movement to gear 72. This angular movement is imparted to gear 74 which, through its connection to eccentric 86, causes the eccentric to rotate about pin 75. As eccentric 86 is rotated, the distance between pin 75 and stop member 87 varies, and, as a result, carriage 16 is pivoted in an upward or downward direction, depending upon the alignment of stop member 87 with respect to the minimum-radius point of eccentric 86.

Accordingly, the apparatus described in connection with Figures 4 and 5 comprises a continuous driving mechanism including several elements (pin 84, lever 78, lever 76, gears 72 and 74 and eccentric 86) which are moveable from the normal inoperative position shown in Figure 4 to the operative position of Figure 5 in which eccentric 86, incorporated in that mechanism, engages stop member 87 mounted on the carriage. The mechanical linkage between selector assembly 36 and this continuous driving mechanism is provided by surface 89 of cam 88, which engages coupling pin 84 and moves the mechanism to its operative position in response to rotation of the selector assembly to the position of Figure 5. Thus, it is apparent that the mechanical driving system comprising shaft 45, knob 66, cam 51, and cam-gear 44 has two distinct ranges of operation. In the first of those ranges of operation, the driving system acts to adjust the tuner in accordance with the preset operating positions determined by the selector mechanism comprising assembly 36 and stop members 62, whereas in the second range of operation the mechanical drive actuates the continuous driving mechanism to permit continuous movement of carriage 16 along its entire path of travel through use of knob 70.

While a particular embodiment of the present invention has been shown and described, it is apparent that changes and modifications may be made without departing from the invention in its broader aspects. The aim of the appended claims, therefore, is to cover all such changes and modifications as will come within the true spirit and scope of the invention.

I claim:

1. A preset tuning mechanism for a continuous tuner of the type including at least one impedance element, a tuning member for varying the impedance of said element, a pivotally mounted carriage, and mechanical coupling means linking said carriage and said tuning member to translate movement of said carriage into movement of said tuning member, said preset mechanism comprising: a selector assembly including a selector shaft and further including a plurality of individual arcuate stop abutment surfaces axially spaced along said shaft and angularly displaced with respect to each other, each of said surfaces having a predetermined radial displacement from said shaft; a corresponding plurality of individually adjustable stop members mounted on said carriage in alignment with said selector assembly and individually selectively engageable with an assigned one of said stop surfaces to determine a corresponding plurality of preset operative positions for said carriage; bias means urging said stop members toward said selector assembly; a mechanical driving system for effecting step-by-step rotation of said selector assembly; and means included in said driving system for pivoting said carriage to a reference position in which each of said stop members is free of its associated stop abutment surface prior to each of said rotational steps and for releasing said carriage to pivot to one of said preset operative positions following said rotation.

2. A preset tuning mechanism for a continuous tuner of the type including at least one impedance element, a tuning member for varying the impedance of said element, a pivotally mounted carriage, and mechanical coupling means linking said carriage and said tuning member to translate movement of said carriage into movement of said tuning member, said preset mechanism comprising: a selector assembly including a selector shaft and further including a plurality of individual arcuate stop abutment surfaces axially spaced along said shaft and angularly displaced with respect to each other, each of said surfaces having a predetermined radial displacement from said shaft; a corresponding plurality of individually adjustable stop members mounted on said carriage in alignment with said selector assembly and individually selectively engageable with an assigned one of said stop surfaces to determine a corresponding plurality of preset operative positions for said carriage; bias means urging said stop members toward said selector assembly; a mechanical driving system for effecting step-by-step rotation of said selector assembly; means included in said driving system for pivoting said carriage to a reference position in which each of said stop members is free of its associated stop abutment surface prior to each of said rotational steps and for releasing said carriage to pivot to one of said preset operative positions following said rotation; a continuous driving mechanism including at least one element moveable from a normal inoperative position to an operative position to mechanically couple said driving mechanism to said carriage; and means mechanically linking said selector assembly and said driving mechanism to move said element to its operative position in response to rotation of said selector assembly to a predetermined position.

3. A preset tuning mechanism for a continuous tuner of the type including at least one impedance element, a tuning member for varying the impedance of said element, a pivotally mounted carriage, and mechanical coupling means linking said carriage and said tuning member to translate movement of said carriage into movement of said tuning member, said preset mechanism comprising: a selector assembly comprising a selector shaft and a plurality of individual arcuate stop abutment members axially spaced along said shaft and angularly displaced with respect to each other, each of said stop abutment members including a stop abutment surface having a predetermined constant radial displacement from said shaft; a corresponding plurality of individually adjustable stop members mounted on said carriage in alignment with said selector assembly and individually selectively engageable with an assigned one of said stop abutment surfaces to determine a corresponding plurality of preset operative positions for said carriage; bias means urging said carriage toward said selector assembly; a mechanical driving system for effecting step-by-step rotation of said selector assembly; and means included in said driving system for moving said carriage to a reference position in which each of said stop members is free of its associated stop abutment surface prior to each of said rotational steps and for releasing said carriage to pivot to one of said preset operative positions following said rotation.

4. In a wave-signal receiver comprising at least one frequency-determining impedance element for conditioning said receiver for operation over a wide band of frequencies, a tuning member for varying the effective impedance of said element, and a carriage mechanically coupled to said tuning member and mounted for movement along a predetermined path to determine the instantaneous operating frequency of said receiver, an actuating mechanism comprising: a selector mechanism including a plurality of preset elements individually selectively operable to adjust said carriage to a predetermined preset position on said path corresponding to a predetermined operating frequency within said band; a continuous driving mechanism, selectively engageable with said carriage for moving said carriage to any point along said path; and a mechanical driving system coupled to said selector and continuous driving mechanisms, said driving system being operable over a first range of operation to actuate said selector mechanism to the exclusion of said continuous driving mechanism selectively to adjust said carriage to said preset positions and being further operable over a second range of operation to actuate said continuous driving mechanism to the exclusion of said selector mechanism and effect movement of said carriage to any point along said path.

5. In a wave-signal receiver comprising at least one frequency-determining impedance element for conditioning said receiver for operation over a wide band of frequencies, a tuning member for varying the effective impedance of said element, and a carriage mechanically coupled to said tuning member and mounted for movement along a predetermined path to determine the instantaneous operating frequency of said receiver, an actuating mechanism comprising: a selector mechanism including a plurality of preset elements individually selectively operable to adjust said carriage to a predetermined preset position on said path corresponding to a predetermined operating frequency within said band; a continuous driving mechanism, selectively engageable with said carriage, to move said carriage to any point along a predetermined portion of said path; and a mechanical driving system coupled to said selector and continuous driving mechanisms, said driving system being operable over a first range of operation to actuate said selector mechanism to the exclusion of said continuous driving mechanism selectively to adjust said carriage to said preset positions and being further operable over a second range of operation to actuate said continuous driving mechanism to the exclusion of said selector mechanism and effect movement of said carriage to any point along said predetermined portion of said path.

6. In a wave-signal receiver comprising at least one frequency-determining impedance element for conditioning said receiver for operation over a wide band of frequencies, a tuning member for varying the effective impedance of said element, and a carriage mechanically coupled to said tuning member and mounted for movement along a predetermined path to determine the instantaneous operating frequency of said receiver, an actuating mechanism comprising: a selector mechanism including a selector shaft, a plurality of individual arcuate stop abutment surfaces axially spaced along said shaft and angularly displaced with respect to each other, and a plurality of stop members mounted on said carriage and individually selectively engageable with said surfaces to adjust said carriage to a predetermined preset position on said path corresponding to a predetermined operating frequency within said band; a continuous driving mechanism, selectively engageable with said carriage, to move said carriage to any point along a predetermined portion of said path; and a mechanical driving system coupled to said selector and continuous driving mechanisms, said driving system being operable over a first range of operation to actuate said selector mechanism selectively to adjust said carriage to said preset positions and being further operable over a second range of operation to actuate said continuous driving mechanism and permit movement of said carriage to any point along said predetermined portion of said path.

7. In a wave-signal receiver comprising at least one frequency-determining impedance element for conditioning said receiver for operation over a wide band of frequencies, a tuning member for varying the effective impedance of said element, and a carriage mechanically coupled to said tuning member and mounted for movement along a predetermined path to determine the instantaneous operating frequency of said receiver, an actuating mechanism comprising: a selector assembly including a selector shaft and further including a plurality of individual arcuate stop abutment surfaces axially spaced along said shaft and angularly displaced with respect to each other, each of said surfaces having a predetermined radial displacement from said shaft; a predetermined plurality of individually adjustable stop members mounted on said carriage in alignment with said selector assembly and individually selectively engageable with an assigned one of said stop abutment surfaces to determine a corresponding plurality of preset operative positions for said carriage, each of said positions corresponding to a preselected operating frequency within said band; a continuous driving mechanism for moving said carriage through a predetermined range along said path; a coupling element included in said continuous driving mechanism and selectively engageable with a predetermined one of said stop abutment surfaces to couple said driving mechanism to said carriage; a mechanical driving system for effective step-by-step rotation of said selector assembly; and means included in said driving system for pivoting said carriage to a reference position in which all of said stop members and said coupling element are free from their associated stop abutment surfaces prior to each of said rotational steps.

No references cited.